(12) United States Patent
Fergusson

(10) Patent No.: US 7,023,222 B2
(45) Date of Patent: Apr. 4, 2006

(54) APPARATUS AND METHOD FOR PROCESSING CAPACITOR SENSOR SIGNALS USING DIGITAL FREQUENCY SHIFT MEASUREMENT TECHNIQUES WITH FLOATING REFERENCE

(75) Inventor: Robert T. Fergusson, Palm Harbor, FL (US)

(73) Assignee: Invisa, Inc., Sarasota, FL (US)

( * ) Notice: Subject to any disclaimer, the term of this patent is extended or adjusted under 35 U.S.C. 154(b) by 0 days.

(21) Appl. No.: 10/525,691

(22) PCT Filed: Sep. 5, 2003

(86) PCT No.: PCT/US03/27795

§ 371 (c)(1),
(2), (4) Date: Feb. 18, 2005

(87) PCT Pub. No.: WO2004/023526

PCT Pub. Date: Mar. 18, 2004

(65) Prior Publication Data

US 2005/0248355 A1    Nov. 10, 2005

Related U.S. Application Data

(60) Provisional application No. 60/408,708, filed on Sep. 6, 2002.

(51) Int. Cl.
   *G01R 27/26* (2006.01)

(52) U.S. Cl. .................................. 324/683; 324/679
(58) Field of Classification Search .................. None
   See application file for complete search history.

(56) References Cited

U.S. PATENT DOCUMENTS

| 3,838,270 A | 9/1974 | Ballinger et al. |
| 4,491,841 A | 1/1985 | Clark |
| 4,567,470 A | 1/1986 | Yoshikawa et al. |
| 5,142,152 A * | 8/1992 | Boiucaner ................ 250/341.7 |
| 2001/0038291 A1 | 11/2001 | Charneau et al. |

* cited by examiner

*Primary Examiner*—Vincent Q. Nguyen
(74) *Attorney, Agent, or Firm*—Gifford, Krass, Groh, Sprinkle, Anderson & Citkowski, P.C.

(57) ABSTRACT

The present invention provides a capacitive sensing technique that is advantageously useful for security applications wherein digital technology is used to measure frequency shifts caused by a conductive or grounded object moving within a capacitive sensing field. The system includes a floating reference to compensate for drifting or offsets caused by electrical noise or other environmental conditions. The system also includes a CPLD integrated circuit or microprocessor and operative to monitor changes in a sensing field signal and digitally compare a reference signal to the sensing field signal such that when a difference between the two signals exceeds a predetermined threshold, an object detection signal is generated by the monitor circuit which causes the activation of an alarm signal.

20 Claims, 1 Drawing Sheet

APPARATUS AND METHOD FOR PROCESSING CAPACITOR SENSOR SIGNALS USING DIGITAL FREQUENCY SHIFT MEASUREMENT TECHNIQUES WITH FLOATING REFERENCE

RELATED APPLICATION

This application claims priority of U.S. Provisional Patent Application Ser. No. 60/408,708 filed Sep. 6, 2002, which is incorporated herein by reference.

FIELD OF THE INVENTION

The present invention relates to capacitive sensing systems for object detection and security systems and, more particularly, to an apparatus and method for capacitive sensing using digital technology with a floating reference.

BACKGROUND OF THE INVENTION

It is common knowledge to sense the presence of an object using capacitive sensing techniques. Illustratively, an oscillator is utilized to deliver a field generating signal to a sensing element wherein the sensing element operates as one of the plates of a capacitor that produces an electric field.

When a conductive or grounded object enters the electric field, it serves as the second plate of the capacitor whereby the capacitance formed between the sensing element and the object changes as the distance varies between the object and the sensing element.

When such techniques are used in conjunction with a parking gate, an error signal is sent to a control unit to stop the movement of a gate that is being lowered upon an approaching vehicle. This technology is disclosed in international application PCT/US01/4253.

A disadvantage associated with the above capacitive sensing technique is that it adapts itself too quickly to a changing environment, that is, when used as a security system it may allow a person to move very slowly towards a protected object without being detected. More particularly, the system includes a phase lock loop (PLL) which adjusts the reference frequency signal in relation to the sensing field signal in a very short time such that the slowly approaching object may not be detected.

Accordingly, there exists a need for a capacitive sensing system that measures frequency shift in response to an approaching object which does not have the disadvantages of a phase lock loop system thereby providing a more reliable and robust system for use in the security industry as well as other applications.

SUMMARY OF THE INVENTION

The present invention provides an apparatus and method for processing capacitive sensing signals using digital techniques for frequency shift measuring and for providing a floating reference.

The inventive capacitive sensing system includes a field generating circuit that produces a sensing field signal that causes a sensing element to generate a capacitive sensing field. When a conductive or grounded object moves within the capacitive sensing field, the sensing field signal is caused to change in frequency and/or phase as the distance between the object and the sensing element varies.

A monitor circuit is connected to the field generating circuit and operates to monitor the sensing field signal that is subject to change in relation to a moving or approaching object.

The monitor circuit includes a reference signal counter for counting and storing a number of digital pulses that occur during one cycle of the undisturbed sensing field signal. The number of pulses counted and stored represents a binary number or digital value.

A field generator signal counter is provided and operates to receive and store the digital value from the reference signal counter. Thereafter, the field generator signal counter operates to begin counting the digital value down towards zero at the beginning of each new cycle of the sensing field signal. If the sensing field signal is disrupted by an approaching object, then the cycle period will be longer and the field generator signal counter will reach zero and begin counting up. If the cycle period of the sensing field signal is shorter than the reference signal, then the field generator signal counter will not reach zero but will stop counting down at the end of the cycle period. In this manner, the field generator signal counter provides a second digital value or binary number that corresponds to the difference between the number of digital pulses occurring during the each new cycle period of the sensing field signal and the value stored in the reference signal counter.

A threshold compare circuit is provided and operates to receive the difference value and compare it to a predetermined value. When the difference value exceeds a predetermined threshold value, the threshold compare circuit is operative to generate an object detection signal.

At least one alarm mechanism is provided and operative to receive the object detection signal and thereafter produce an alarm signal that causes at least one alarm device to be activated accordingly.

BRIEF DESCRIPTION OF THE DRAWINGS

A better understanding of the present invention will be had upon reference to the following detailed description when read in conjunction with the accompanying drawings in which like parts are given like reference numerals and wherein.

DETAILED DESCRIPTION OF THE INVENTION

Figure 1:
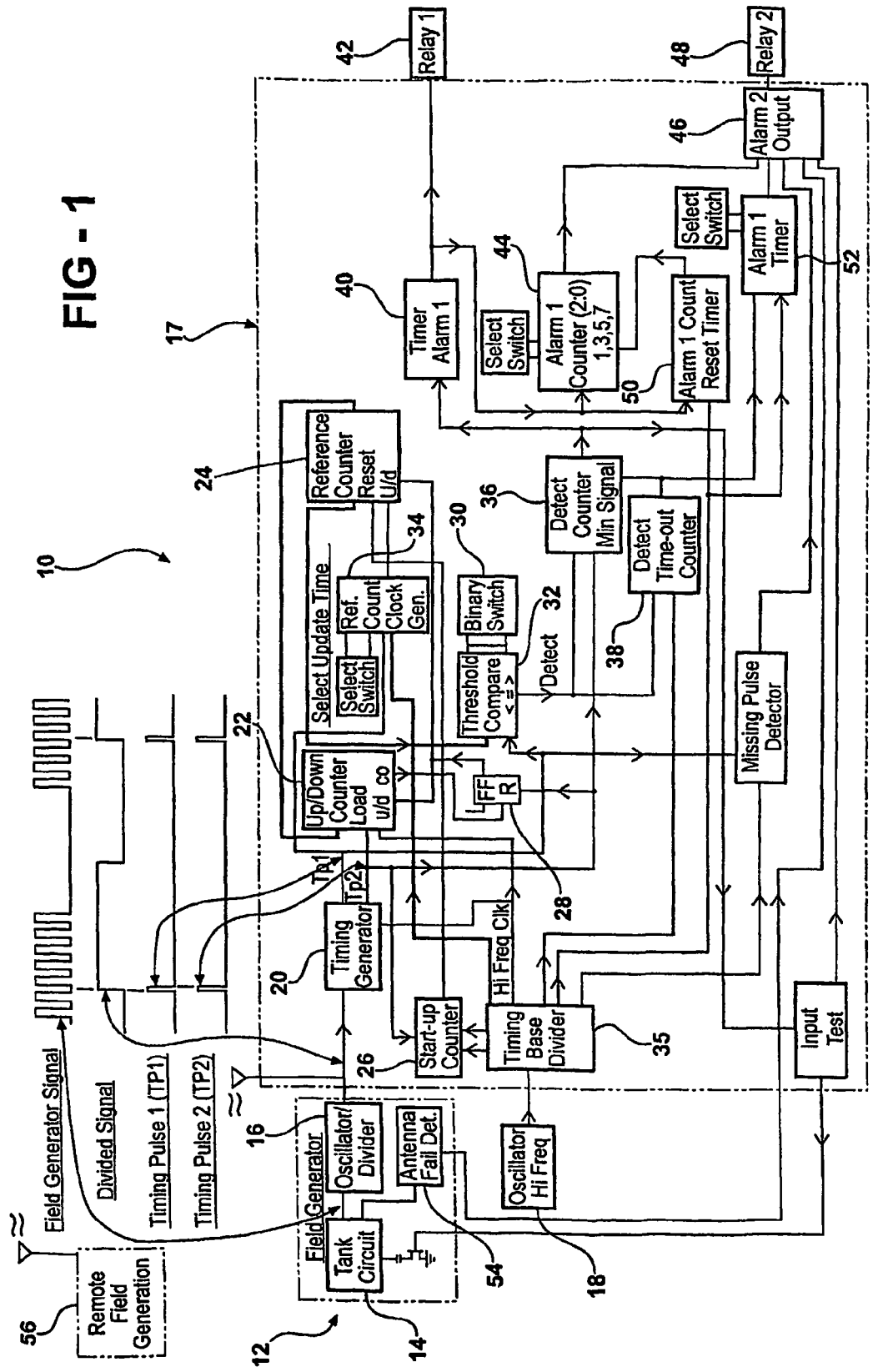
FIG. 1 is a block diagram of the capacitive sensing system that utilizes digital processing and a floating reference as according to the invention.

The present invention provides a capacitive sensing technique that utilizes digital technology to measure frequency shifts caused by a conductive or grounded object moving within a capacitive sensing field. The system includes a floating reference to compensate for drifting or offsets of the reference signal due to electrical noise or other environmental conditions. The system avoids the limitations associated with object detection systems that utilize a phase lock loop (PLL) for comparing the sensing field signal to the reference signal wherein small sensing field signal anomalies may go unnoticed due to the inherent signal-tracking feature of the PLL.

The present invention is advantageously useful for security applications but can be applied to other areas such as safety sensors for barrier, slide and swing gates as well as other applications. The inventive system uses a tank circuit and oscillator/divider front end that operates as a field generator. The output of this front end is fed into the processing or monitor circuit. The monitor circuitry can consist of discrete logic, a CPLD integrated circuit or microprocessor. In a preferred embodiment, it is implemented on a CPLD device.

FIG. 1 shows the block diagram of the sensing system 10. A field generating circuit 12, having an antenna, a tank circuit 14 and oscillator circuitry 16, is implemented outside the monitor circuit 17. The field generating circuit 12 preferably runs at a frequency of 1 MHz and is divided down to a signal that is 1 to 5 milliseconds long depending on the application. It is appreciated that other field generating frequencies may be used without departing from the scope of the invention. The divided down signal is processed by the monitor circuit 17 to determine the amount of frequency shift caused by the capacitive coupling of an approaching object to the field generating circuit 12.

A high frequency fixed oscillator 18 is utilized to provide the clock timing to the various internal counters. The divided down field generator signal is fed into a pulse generator 20 where it is synchronized with the high frequency clock signal 18 and thereafter converted to two short sequential timing pulses, TP1 and TP2.

TP2 is fed into the Load input of an up/down field generator signal counter 22. This causes the counter 22 to be loaded with a value previously determined by a reference signal counter 24. The reference counter 24 is initialized by a startup counter 26, which causes it to count the number of high frequency clock signals in one divided down field generated signal cycle or period. Once the startup cycle ends, the reference counter 24 is incremented and decremented at a much slower rate under conditions that will be described hereinafter.

The high frequency oscillator 18 operates as the clock for the signal counter 22. Each time a new pulse from the field generating circuit 12 occurs, the signal counter 22 starts counting down from its previously loaded value received from the reference counter 24. If the count of the signal counter 22 reaches zero then a flip-flop 28 is set and the signal counter 22 is caused to immediately count up. This would occur if the frequency input from the field generating circuit 12 were lower due to someone approaching the antenna, thereby causing the sensing field signal to be longer. The signal counter 22 would not reach zero if the frequency of the sensing field signal is higher.

Under ideal conditions, such as a noise-free environment, the frequency of the field generator circuit 12 would match that of when it was first stored in the reference counter 24. In such case, the signal counter 22 would count down to a value that would be near zero during one cycle of the sensing field signal. The count value of the signal counter 22 is compared to the setting on a binary switch 30 associated with a threshold compare circuit 32 at the beginning of each new pulse. This binary switch 30 sets the limit or threshold as to how far the count value can vary from the zero value. This comparison takes place when TP1 occurs.

The more the count value varies from zero, the greater the difference between the reference frequency and the instant frequency. The difference may be either plus or minus. If the signal is greater than what is programmed into the sensitivity setting of the binary switch 30, an object detection signal will occur. The signal counter 22 will then be reloaded with the reference counter value on the next occurrence of the TP2 pulse and the process will repeat thereafter. The system 10 may be set up to only detect approaching objects or only objects that are moving away as desired by looking at the output state of the flip-flop 28.

The reference counter 24 is initialized at setup, as described above. It is then switched over to be clocked up or down at a much slower rate under certain conditions. The reference counter value needs to change in order to compensate for environmental changes, which can cause the signal from the field generating circuit 12 to drift. A reference counter clock generator circuit 34 uses different clock outputs from the timing base divider 35 for controlling how often the reference counter 24 is to be updated. The update clock input of the reference counter 24 is synchronized with TP1.

Every time the update clock occurs, the reference counter 24 will be changed up or down depending on the status of the flip-flop 28 on the output of the signal counter 22 at the time a new sensing field signal is received from the field generating circuit 12. If the count has gone past zero then the reference counter 24 will be incremented by one. If it has not gone past zero then the reference counter 24 will be decremented by one. This allows for the reference signal to be auto adjusted very slowly while preventing someone from creeping up on the system 10.

When a detect signal is generated from the compare threshold circuit 32, it is fed into a detect counter 36 that counts the number of times it occurs within a given time limit. A detect timeout counter 38 will cause the detect counter 36 to be reset if enough pulses do not occur within a time limit. The detect timeout counter 38 is reset each time a new detect signal is detected. If the count value for the detect counter 36 is exceeded, then an alarm signal is generated by the Alarm1 timer 40. The Alarm1 timer output can be used to trigger a device to warn an intruder that they have been detected.

The output of the detect counter 36 is also fed into an Alarm1 counter 44 that counts the number of times an Alarm1 timer 40 signal occurs. The Alarm1 counter 44 can be preset to allow a specified number of counts before it trips the main alarm output, Alarm2 46 which would be connected to the main building alarm system in security applications. The counts must occur within a given time period as determined by the Alarm1 count reset timer 50 which will reset the number of counts after a given time has passed since the last alarm occurred. The Alarm1 count reset timer 50 can be set to a specified value by the user setting up the system.

A second process may also be used to determine if the Alarm2 relay 48 should be activated. The detect counter 36 output may be fed into an Alarm1 Timer 52 that will activate if an anomalous signal is present for a given amount of time. This is necessary because an intruder could activate the Alarm1 signal and keep it activated so it would not increment a second or third time. Illustratively, this would be a problem if the Alarm1 count were set to trip the Alarm2 output 46 after three counts. In such case, an Alarm2 condition would never occur if the Alarm1 signal occurred only once for a long period of time. The amount of time an intruder needs be present is greater than what a nuisance signal causing Alarm1 42 to trigger but less than what it would take to break in by an intruder. The time is programmable to different ranges by the operator to accommodate various conditions.

The Alarm1 relay 42 will be energized when a warning alarm is to be generated. The Alarm2 relay 48 will be energized as long as the system is powered up and there is no Alarm2 signal. It will only be de-energized during an Alarm2 condition causing the normally closed relay 48 contacts to open. This provides for a failsafe protection that will cause an Alarm2 signal to occur for any failure in the system 10.

Preferably, the system 10 will also have antenna failsafe detection circuit 54 that will determine if an input oscillator has stopped working or if the antenna has been disconnected. If either condition occurs, then the Alarm2 relay 48 will be signaled.

Another important feature is that the system 10 is operative to determine when someone has locked onto the frequency of the antenna and then connects an oscillator to the antenna that is runs at the same frequency as the field generating circuit 12 to force the field generating circuit 12 to stay at that frequency. In such case, the system 10 includes the ability to add small capacitive values to the input tank circuit 14 in the field generating circuit 12 that should cause it to alarm. The system 10 verifies that the alarm would have occurred if the frequency shifts. If the alarm does not occur because someone is forcing the frequency to remain at a fixed value through a low impedance-driving source, the Alarm2 relay 48 would be activated.

A variation of the above embodiment involves having the option of having a remote field generating circuit 56 that can be connected to the main monitor circuit 17. In this case, the on board field generating circuit 12 would be disabled by a switch setting or automatically upon detecting the remote field generating circuit 56.

Further, the system 10 may include more than one sensitivity setting available in case it is desirable for the system 10 to be less sensitive during the daytime when a large number of people are normally present. The system 10 could be set to a more sensitive level when people should not be present. The adjusting of the sensitivity can be controlled from a remote location by using a separate control input. If the system 10 is used in safety applications on devices such as barrier gates or garage doors, then this function may be used to reduce the sensitivity when the door or gate is near the closed position.

Still further, the system 10 may be provided with an input to prevent an alarm condition from happening during a specific time period. The reason for this in the security industry could be because a person is setting up the device and would not want multiple false alarms being sent to the main alarm panel during setup. In safety applications, the alarm disabling feature could be used to disable the alarm when the door is within inches of being in the closed position where the capacitive influence from the ground on the field generating circuit 12 is quite strong.

Alternatively, the reduced sensitivity or disable alarm feature may occur temporarily for a specified time period once the inputs have been triggered. This feature may be necessary when the controlling input is a temporary pulse rather than a constant input.

When the system 10 is used in the parking gate industry, the reference counter 24 may be operative to update itself at different rates depending on if the frequency is increasing or decreasing, i.e., an object is moving towards or away from the antenna. As a barrier or gate arm approaches an object, the auto correction or update time would be slower. This is to make sure that the system 10 is not going to self-correct itself before detecting the object. The system 10 will adapt to being close to ground when it is in the closed position. As the gate opens, the system 10 must update the reference counter 24 at a much higher rate in order to be ready for the next closing cycle.

As an alternative embodiment, the inventive system 10 may be implemented using a microprocessor or microcontroller. In such case, an internal counter is clocked by the microprocessor. A capture compare register in the microprocessor stores the value of the counter every time the divided down field generator clock signal occurs. This value is then subtracted from the previously stored value. The count difference is compared against a previously stored reference count. The reference count is updated on a periodic basis using similar algorithms as described above.

Another alternative to the threshold adjustment in safety applications is to use a microprocessor to memorize the profile of the frequency shift as a gate closes and then use this profile to dynamically adjust the threshold based on the door or gate position as it opens and closes. It is appreciated that as the gate moves toward the gate post or closed position, the sensing field signal changes due to the change in capacitance between the sensing element and the grounded gate post. A profile of this changing capacitance can be captured and utilized to dynamically reduce the system's sensitivity as the gate approaches the gate post during closing. A timing circuit may be utilized as a means of tracking gate position from a reference point whereby the de-sensitizing process would begin when the timing circuit corresponds to a predetermined threshold value.

Alternatively, position sensing circuit, such as a magnetic sensor, may be utilized to determine the position of the gate based on the rotational movement of a gear or sprocket integrated into the drive circuit for closing the gate. It is appreciated that other methods and devices may become apparent to those skilled in the art for determining the gate position such that the system's sensitivity can be dynamically adjusting the system's sensitivity however without exceeding the scope of the invention.

A method for object detection using the capacitive sensing system as according to the invention comprises the steps of providing a field generating circuit that is operative to produce a sensing field signal and to generate a capacitive sensing field. The process continues by providing a monitor circuit in communication with the field generating circuit being operative to monitor the sensing field signal which changes in response to an object moving within the capacitive sensing field.

The step of providing a monitor circuit in communication with the field generating circuit comprises providing a reference signal counter operative to count digital pulses and store a first digital value that corresponds to the number of digital pulses counted during a first cycle of a sensing field signal. Thereafter, a field generator signal counter is provided to receive and store the first digital value from the reference signal counter. The reference signal counter is operative to begin counting down from the first digital value at each new cycle of the sensing field signal. The field generator signal counter is also operative to continue counting down until the digital value equals zero or until the cycle period ends. The digital value of the field generator counter at the end of the cycle corresponds to the difference between the number of digital pulses that occur during each new cycle and the value stored in the reference signal counter.

Next, a threshold compare circuit is provided and operative to receive the difference value and compare it to a predetermined value. If the difference value exceeds a predetermined threshold value, then the threshold compare circuit operates to generate an object detection signal. Finally, at least one alarm mechanism is provided that is operative to receive the alarm signal and activate at least one alarm device according to the system detecting an object.

From the foregoing, it can be seen that the present invention provides a reliable and robust capacitive sensing system that utilizes digital technology to provide advantages over conventional systems. One skilled in the art upon reading the specification may come to appreciate changes and modifications that do not depart from the spirit of the invention as defined by the scope of the appended claims.

I claim:

1. A capacitive sensing system comprising:
   a field generating circuit operative to produce a sensing field signal and to generate a capacitive sensing field, said sensing field signal operative to change in response to an object moving within capacitive sensing field; and
   a monitor circuit in communication with said field generating circuit operative to monitor said sensing field signal, said monitor circuit comprising:
      a reference signal counter operative to count and store digital pulses that occur during a first cycle of said signal field signal wherein said stored digital pulses correspond to a first digital value;
      a field generator signal counter operative to receive and store said first digital value from said reference signal counter, and operative to begin counting down from said first digital value at each new cycle of said sensing field signal, and operative to continue counting down until said field generator signal counter equals zero or until said new cycle ends, and operative to count to a second digital value that corresponds to the difference between the number of digital pulses occurring during said new cycle and the value stored in the reference signal counter; and
      a threshold compare circuit operative to receive the difference value and compare it to a predetermined value, and operative to generate an object detection signal when said difference value exceeds a predetermined threshold value.

2. The system of claim 1 further comprising a reference signal counter clock circuit operative to cause said reference signal counter to be incremented or decremented in response to environmental changes.

3. The system of claim 1 further comprising an object detection signal counter operative to receive said object detection signal from said threshold compare circuit and generate an alarm signal when said object detection signal counter exceeds a predetermined count value.

4. The system of claim 1 wherein the field generator signal counter is operative to begin counting up after counting down to zero such that said second digital value is obtained.

5. The system of claim 1 wherein the field generating circuit comprises a tank circuit, an oscillator and a sensing element.

6. The system of claim 1 further comprising at least one alarm mechanism wherein said alarm mechanism comprises a primary alarm for warning an intruder of detection.

7. The system of claim 6 wherein the at least one alarm mechanism further comprises a secondary alarm that includes a building alarm system.

8. The system of claim 7 wherein the at least one alarm mechanism includes a timer circuit that activates the secondary alarm after single object detection signal has persisted beyond a predetermined period of time.

9. The system of claim 6 further comprising an alarm disabling circuit operative to allow for the at least one alarm mechanism to be disabled during the desired time period.

10. The system of claim 1 wherein the monitor circuit is complex programmable logic device (CPLD).

11. The system of claim 1 wherein the monitor circuit is a microprocessor.

12. The system of claim 1 further comprising a failsafe circuit operative to activate said at least one alarm mechanism upon detecting a fault in the system.

13. The system of claim 1 further comprising a tamper detection circuit operative to activate the at least one alarm mechanism in response to detecting tampering at the field generating circuit.

14. The system of claim 1 further comprising a remote field generating circuit operative to be selectably placed in communication with the monitor circuit.

15. The system of claim 14 wherein the field generating circuit is operative to automatically disconnect from the monitor circuit upon detecting said remote field generating circuit.

16. The system of claim 1 further comprising a sensitivity adjustment switch operative to allow for the sensitivity of the system to be changed as desired.

17. The system of claim 16 wherein the sensitivity adjustment switch is operative to be adjusted using a remote control device.

18. The system of claim 1 further comprising an alarm disabling circuit operative to allow for the at least one alarm mechanism to be temporarily disabled for a predetermined amount of time.

19. The system of claim 1 further comprising a sensitivity adjusting circuit operative to automatically adjusts the system sensitivity in response to sensing a predetermined condition.

20. A method of object detection comprising the steps of:
   providing a field generating circuit operative to produce a sensing field signal and to generate a capacitive sensing field, said sensing field signal operative to change in response to an object moving within capacitive sensing field; and
   providing a monitor circuit in communication with said field generating circuit operative to monitor said sensing field signal, wherein said step of providing a monitor circuit further comprises the steps of:
      providing a reference signal counter operative to count digital pulses and store a first digital value that corresponds to the number of digital pulses counted during a first cycle of said signal field signal;
      providing a field generator signal counter operative to receive and store said first digital value from said reference signal counter, and operative to begin counting down from said first digital value at each new cycle of said sensing field signal, and operative to continue counting down until said field generator signal counter equals zero or until said new cycle ends, and operative to count to a second digital value that corresponds to the difference between the number of digital pulses occurring during said new cycle and the value stored in the reference signal counter;
      providing a threshold compare circuit operative to receive said difference value and compare it to a predetermined value, and operative to generate an object detection signal when said difference value exceeds a predetermined threshold value; and
   providing at least one alarm mechanism operative to receive said alarm signal and activate at least one alarm device.

* * * * *